US006982518B2

(12) United States Patent
Chou et al.

(10) Patent No.: US 6,982,518 B2

(45) Date of Patent: Jan. 3, 2006

(54) METHODS AND APPARATUS FOR AN LED LIGHT

(75) Inventors: Der Jeou Chou, Mesa, AZ (US); Daniel Nelson, Cave Creek, AZ (US); Thomas Kulaga, Chandler, AZ (US)

(73) Assignee: Enertron, Inc., Mesa, AZ (US)

( * ) Notice: Subject to any disclaimer, the term of this patent is extended or adjusted under 35 U.S.C. 154(b) by 0 days.

(21) Appl. No.: 10/943,061

(22) Filed: Sep. 16, 2004

(65) Prior Publication Data

US 2005/0073244 A1 Apr. 7, 2005

Related U.S. Application Data

(60) Provisional application No. 60/540,743, filed on Jan. 30, 2004, provisional application No. 60/507,858, filed on Oct. 1, 2003.

(51) Int. Cl.
*H01L 33/00* (2006.01)
*F21V 29/00* (2006.01)

(52) U.S. Cl. ........................ 313/46; 313/498; 362/800

(58) Field of Classification Search ................ 313/498, 313/502, 512, 46, 36, 40, 113; 362/800, 362/373; 315/169.3
See application file for complete search history.

(56) References Cited

U.S. PATENT DOCUMENTS

| | | | |
|---|---|---|---|
| 4,211,955 A | 7/1980 | Ray | |
| 4,630,183 A | 12/1986 | Fujita | |
| 4,727,289 A | 2/1988 | Uchida | |
| 5,463,280 A | 10/1995 | Johnson | |
| 5,575,459 A | 11/1996 | Anderson | |
| 5,655,830 A | 8/1997 | Ruskouski | |
| 5,688,042 A | 11/1997 | Madadi et al. | |
| 5,726,535 A | 3/1998 | Yan | |
| 6,149,283 A | 11/2000 | Conway et al. | |
| 6,220,722 B1 | 4/2001 | Begemann | |
| 6,234,649 B1 | 5/2001 | Katougi | |
| 6,367,949 B1 * | 4/2002 | Pederson | 362/240 |
| 6,499,860 B2 | 12/2002 | Begemann | |
| 6,719,446 B2 | 4/2004 | Cao | |
| 6,787,999 B2 * | 9/2004 | Stimac et al. | 315/51 |
| 6,815,724 B2 * | 11/2004 | Dry | 257/88 |
| 2002/0070643 A1 | 6/2002 | Yeh | |
| 2003/0039119 A1 | 2/2003 | Cao | |
| 2003/0048632 A1 | 3/2003 | Archer | |
| 2003/0189829 A1 | 10/2003 | Shimuzu et al. | |
| 2004/0066142 A1 | 4/2004 | Stimac et al. | |
| 2004/0066652 A1 | 4/2004 | Hong | |
| 2004/0105264 A1 | 6/2004 | Spero | |

OTHER PUBLICATIONS

New York Times Article dated Apr. 8, 2004, by Ian Austen, Entitled: "L.E.D.'s Make for Warm Light But the Bulb Keeps Its Cool," p. E3.

* cited by examiner

*Primary Examiner*—Karabi Guharay
(74) *Attorney, Agent, or Firm*—Snell & Wilmer LLP

(57) ABSTRACT

An LED lighting device for use in place of a commercial-standard light bulb. For example, a commercial-standard light bulb typically has an outer surface profile, generally defining its shape and the LED lighting device has its own surface profile which substantially mimics the surface profile of the commercial-standard light bulb. Additionally, LED lighting device may further comprise a heat sink for dissipating energy generated by the LED lighting device. In accordance with various embodiments, the heat sink creates the LED lighting device's outer surface profile and is configured to substantially mimic the outer surface profile of the commercial-standard light bulb.

7 Claims, 13 Drawing Sheets

SECTION A-A

SECTION B-B

METHODS AND APPARATUS FOR AN LED LIGHT

CROSS REFERENCE TO RELATED APPLICATIONS

This application claims priority of U.S. Provisional Patent Application Nos. 60/507,858 filed Oct. 1, 2003, and 60/540,743, filed Jan. 30, 2004 and U.S. patent application Ser. No. 10/924,389, filed Aug. 23, 2004 which is also incorporated herein by reference.

FIELD OF THE INVENTION

The present invention generally relates to LED lighting products.

BACKGROUND OF THE INVENTION

Light emitting diodes (LEDs) have been used for decades in applications requiring relatively low-energy indicator lamps, numerical readouts, and the like. In recent years, however, the brightness and power of individual LEDs has increased substantially, resulting in the availability of 1 watt and 5 watt devices.

While small, LEDs exhibit a high efficacy and life expectancy as compared to traditional lighting products. For example, a typical incandescent bulb has an efficacy of 10–12 lumens per watt, and lasts for about 1000 to 2000 hours; a general fluorescent bulb has an efficacy of 40 to 80 lumens per watt, and lasts for 1000 to 2000 hours; a typical halogen bulb has an efficacy of 20 lumens and lasts for 2000 to 3000 hours. In contrast, red-orange LED can emit 55 lumens per watt with a life-expectancy of about 100,000 hours.

Notwithstanding recent advances in LED efficiency, and the promise of dramatic energy savings, known systems have failed to capitalize on the LED's desirable characteristics and produce systems that can replace standard lighting products used in the commercial and consumer realms. This is primarily due to the limitations inherent in currently known light engines.

For example, commercial high power LED devices generate an enormous amount of heat—on the order of about 50 $W/cm^2$. In order to achieve reliability and long life, it is important to keep the temperature of the LED devices fairly low. Currently known systems have failed to assemble multiple LEDs in a compact fashion while maintaining the necessary heat transfer characteristics.

Furthermore, efforts to incorporate multiple color LEDs to produce white light have been undesirable because, even when the LED devices are assembled in close proximity (which is again limited by heat transfer considerations), the light produced by such systems is not well mixed, resulting in uneven blotches of individual colors rather than uniform projection of white light. Similarly, current production compound semiconductor LED colors cannot produce certain wavelength efficiently (e.g., 575 nm yellow light). Mixing of efficient red and green LED light is a better approach.

Accordingly, there is a need for LED light engine devices that overcome these and other limitation of the prior art.

SUMMARY OF THE INVENTION

In general, the present invention provides a novel, an LED lighting device for use in place of a commercial-standard light bulb. For example, a commercial-standard light bulb typically has a first outer surface profile, generally defining its shape and the LED lighting device has its own surface profile (e.g., a second) which substantially mimics the surface profile of the commercial-standard light bulb.

Additionally, in accordance with various embodiments, the LED lighting device further comprises a heat sink for dissipating energy generated by the LED lighting device. In accordance with various aspects of the present invention, the heat sink comprises the second outer surface profile noted above and is configured to substantially mimic the first outer surface profile.

In this way, the present invention provides a high-efficiency LED lighting device suitable for a wide range of lighting applications.

BRIEF DESCRIPTION OF THE DRAWINGS

A more complete understanding of the present invention may be derived by referring to the detailed description when considered in connection with the Figures, where like reference numbers refer to similar elements throughout the Figures, and.

DETAILED DESCRIPTION

The following description is of exemplary embodiments of the invention only, and is not intended to limit the scope, applicability or configuration of the invention in any way. Rather, the following description is intended to provide a convenient illustration for implementing various embodiments of the invention. As will become apparent, various changes may be made in the function and arrangement of the elements described in these embodiments without departing from the scope of the invention.

Overview

In general, an LED lighting device in accordance with the present invention comprises an on-board or self-contained power converter for providing a desired output voltage (e.g., a rectifier) and a light engine having a high thermal conductivity substrate (e.g., a metal-clad PCB), a plurality of light-emitting-diode (LED) semiconductor devices mechanically connected to the substrate, an outer dike fixed to the substrate and surrounding at least a portion of (preferably all of) the LED devices, and a substantially transparent polymeric encapsulant (e.g., optical-grade silicone) disposed on the plurality of LED devices and restrained by the outer dike. In one embodiment, the light engine includes a reflector (e.g., a generally conic reflector) fixed to the substrate to form the outer dike and to assist in directing and focusing light and/or mixing of light from two or more LED devices having different colors. In other embodiments, as discussed further below, one or more optical components such as filters, lenses, and the like are fixed to the encapsulant coating.

Body Configuration

As noted above, in accordance with various aspects of the present invention, LED lighting device is configured to replace a commercial-standard light bulb and generally comprises a body 20, a light engine 100, an electrical connector 22 (e.g., a standard Edison style connector for connecting LED lighting device to a socket) and various other components.

In accordance with the presently described embodiment, body 20 generally comprises one or more elements which house, protect and/or otherwise contain or hold the power converting, light producing and electrical connectivity components of LED lighting device. In various embodiments, body 20 is a suitably rigid, solid material having suitably high heat transfer properties for dissipating heat from the other components of LED lighting device. For example, various metals and/or ceramics such as aluminum alloys, copper alloys brass, magnesium alloys, carbon polymer, carbon composite, and high thermal conductive ceramics have characteristics which are desirable in this respect.

Additionally, in various embodiments, body 20 may be configured with substantially any shape, and have anywhere from a continuous, generally "smooth" surface, to an interrupted, non-continuous surface (e.g., fins). Moreover, in various applications and as also described below, body 20 may be shaped similar to commercial-standard light bulbs.

Figure 1:
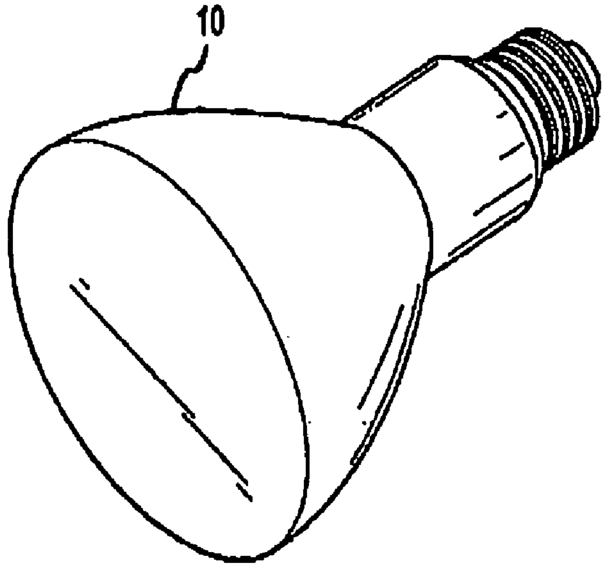
(PRIOR ART) FIG.1
FIG. 1 is an isometric overview of a commercial-standard light bulb.

In particular, in accordance with various embodiments of the present invention, as noted above, LED lighting device is intended to replace and/or mimic a commercial-standard light bulb. For example, a commercial-standard light bulb, such as that depicted in FIG. 1 (e.g., a BR30 flood bulb), has a first outer surface profile 10, generally defining its shape. In the context of the present invention, LED lighting device has its own, second surface profile 24 which is substantially coincident with first surface profile 10 of the commercial-standard light bulb and, as such, in various embodiments mimics or nearly mimics the size and shape of the commercial-standard bulb. It should be understood that, in the context of the present invention, nearly any light bulb shape can be mimicked or substantially mimicked, and that second outer surface profile can be configured in substantially any shape and still fall within the ambit of the present invention.

As noted above, currently known commercial high power LED devices generate a significant amount of energy (heat). LED lighting devices in accordance with various embodiments of the present invention further comprise a heat sink in communication with the various components of LED lighting device for dissipating such energy. Generally, heat sink comprises any physical device which assists heat dissipation by conduction and/or convection. In accordance with various embodiments, heat sink may be a separate, individual component of LED lighting device, or alternatively, other components of LED lighting device may act as a heat sink in addition to any other functions the particular component may have.

Figure 2:
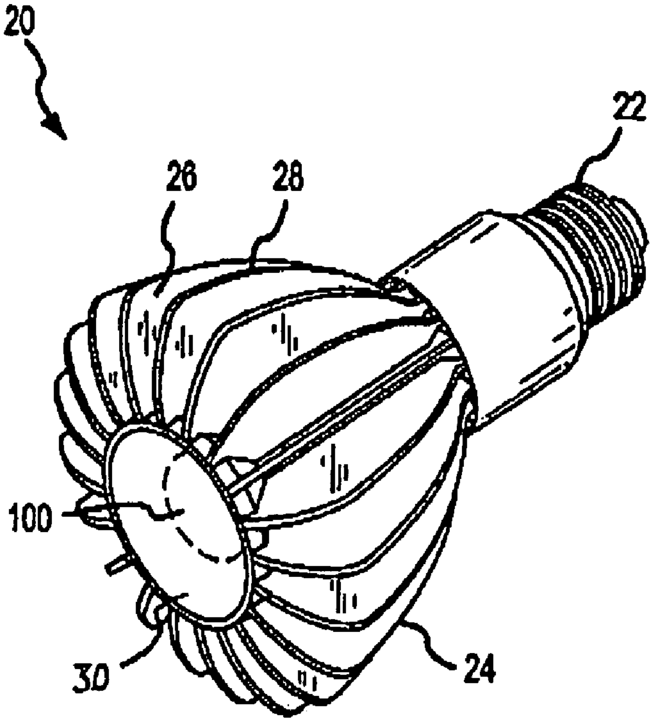
FIG. 2 is an isometric overview of an LED lighting device in accordance with an embodiment of the present invention.

For example, in accordance with various embodiments of the present invention, body 20 may act as a heat sink. In such embodiments, body 20 may be configured in various shapes and sizes which facilitate the heat dissipation, for example, by increasing the surface of area of body 20. For example, as shown in FIG. 2, body 20 is configured as a number of fins 26, thereby increasing the surface area of body 20, and thus, the amount of heat body 20 can dissipate.

Further still, in accordance with various embodiments of the present invention, the heat sink also defines second outer surface profile 20. For example, with continued reference to FIG. 2, body 20 and cooling fins 26 act as the heat sink. Each respective fin 26 is configured such that an outer edge 28 represents a segment of a cross section of first outer surface profile 10 of a commercial-standard bulb. Thus, placement of a plurality of fins 26 about LED lighting device, as in, for example, FIG. 2, thereby generates second outer surface profile 20, which in turn is substantially similar to the commercial-standard bulb, and which still further provides the benefits of being a heat sink.

LED Connectivity

Figure 3:
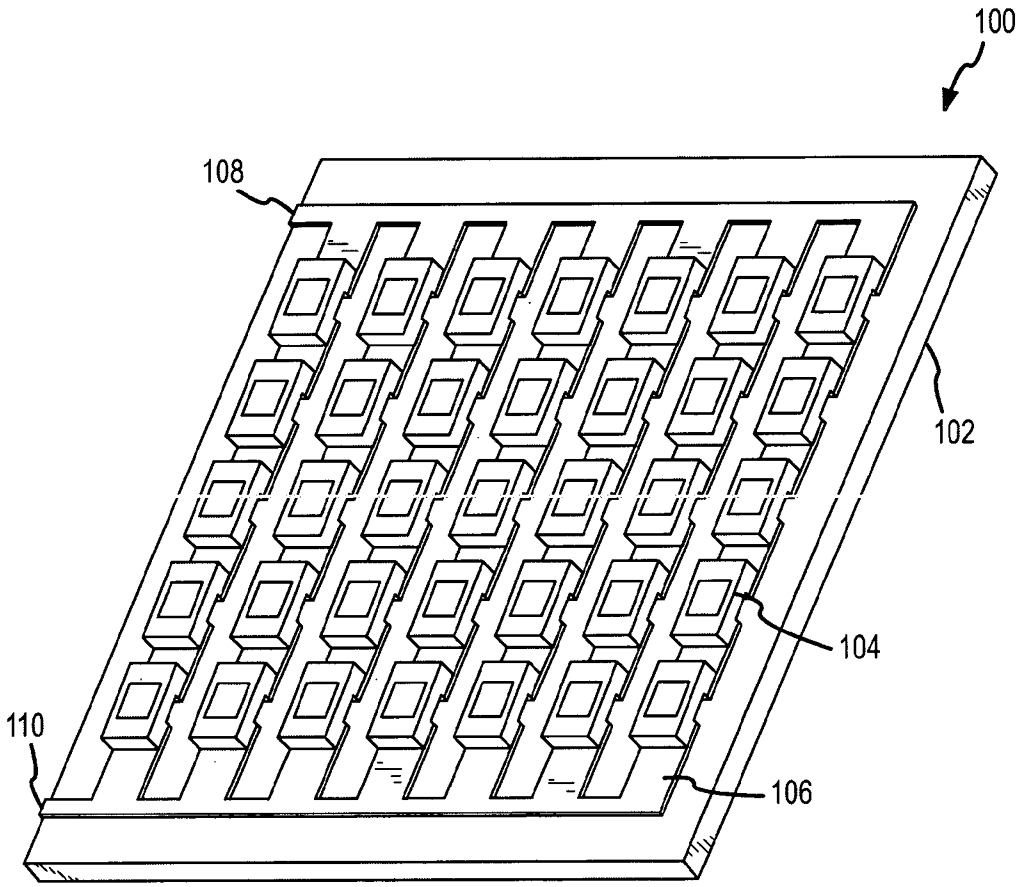
FIG. 3 is an isometric overview of a light engine in accordance with one embodiment of the present invention having a plurality of surface-mounted LED chips configured in parallel and series.

First, referring to FIG. 3, which shows an exemplary electrical topology applicable to the present invention, light engine 100 includes a plurality of LED devices 104 (in this embodiment, surface-mount LED chips) connected to a high thermal conductivity substrate (or simply "substrate") 102. In this embodiment, substrate 102 includes a conductive trace pattern 106 to which the plurality of LED devices 104 are electrically and mechanically connected.

Trace pattern 106 is configured to interface with an AC or DC power source, depending upon the application. For example, in the illustrated embodiment, a DC V+terminal 108 and a $V_o$ terminal 110 are provided. These terminals are, in some instances, more generally referred to herein as the "input".

LED devices 104 are electrically interconnected in any suitable manner. As shown in FIG. 3, for example, LED devices 104 may be configured in a circuit such that sets of individual devices are connected in series, wherein these sets are themselves connected in parallel with respect to the input. In the illustrated embodiment, seven parallel columns, each including five series-connected LED devices, are themselves connected in parallel with across terminals 108 and 110. Alternatively, with momentary reference to FIG. 5, the plurality of LED devices 104 (in this embodiment, 49 wire-bonded chips) are connected in series with respect to terminals 110 and 108.

In general, notwithstanding the illustrated embodiments described above, the present invention comprehends the use of any number of LED devices configured in any suitable electrical topology (series, parallel, or a combination thereof) and any suitable geometry. For example, the LED devices may be positioned in a rectilinear pattern (a square or rectangular array, for example), a circular or curvilinear pattern, a random or stochastic pattern, or any combination thereof. Furthermore, the LED devices may be laid out in multiple regions, where each of the regions exhibit different patterns and numbers of devices.

The number of LED devices 104 incorporated into the device may be selected in accordance with a number of design variables, including, for example, the nature of the power source (AC converted to DC, available DC voltage, available power, etc.), the nature of the LED devices themselves (e.g., forward voltage (Vf), power rating, emitting intensity, wavelength, etc.), the desired color combination (described below), the nature of substrate 102 (e.g., thermal conductivity, geometry, etc.), and the nature of the application and external thermal conditions.

Figure 14:
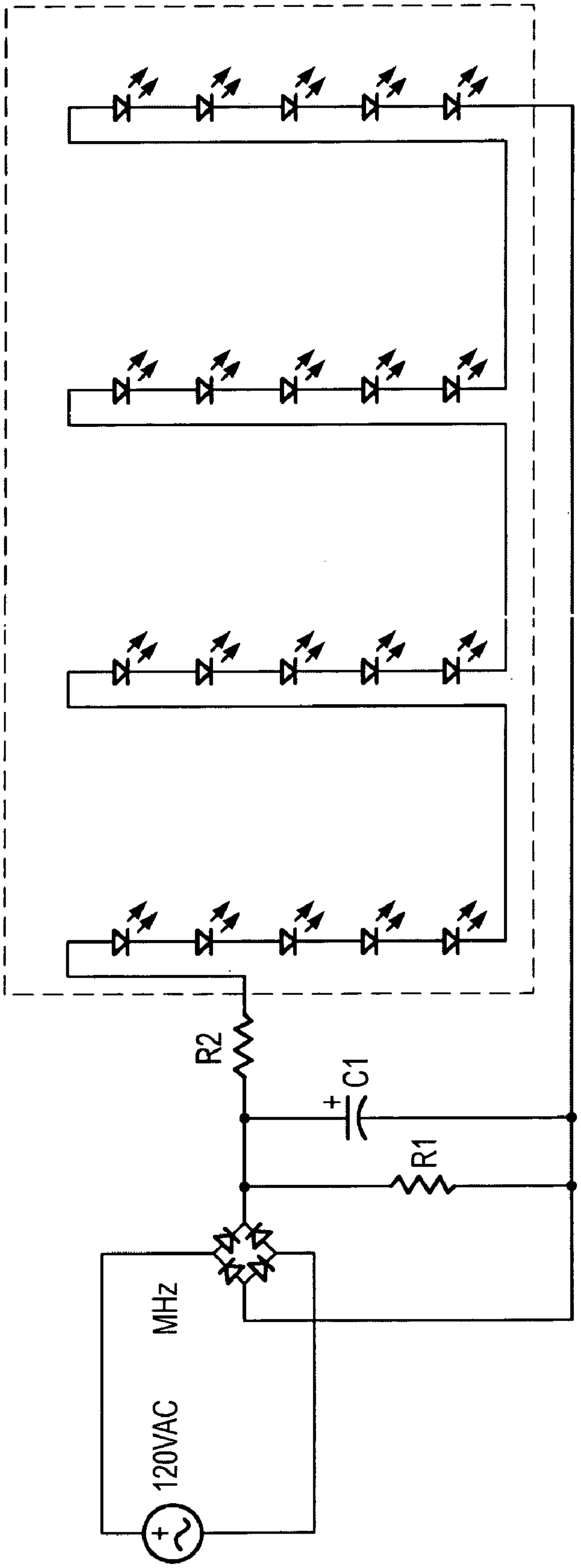
FIG. 14 is a diagram of a circuit with LED chips connected in series in accordance with an embodiment of the present invention.

Briefly, before being input into the set of LEDs, the applied voltage generally must be within a range dictated by the capabilities of the particular LED's used. As such, in accordance with various embodiments of the present invention, LED lighting device comprises a power converter depending on its configuration can step-up, step-down and/or convert from AC to DC. For example, in various embodiments, power converter comprises a rectifier such as a bridge circuit electrically connected to a plurality of LED's, similar to that illustrated in FIG. 14, wherein the LEDs (1402) are coupled to power converter 104 and power source 1406. Preferably, power converter 1404 is fully self contained within LED lighting device and/or body 20.

That said, in one embodiment, the LED devices are connected in series or parallel such that the overall combined forward voltage of the LED devices matches the electrical input. For example, in a household application in US and Canada, 120 VAC must be rectified by power converter to 162V DC before can be input to LED's. Normally, 40 to 80 LED devices can be connected in series, depending upon the $V_f$ of the individual LEDs, to take the input of 162V rectified DC. As is known, typical red and amber LED devices have a nominal $V_f$ of about 1.8 to 2.5 V, and green and blue LEDs have a nominal $V_f$ of about 3.0 to 4.5 V.

By matching the combined forward voltage with the voltage of the input source, the power supply for the light engine can be simplified such that no bulky, complicated voltage step-up or step-down transformers, or switching power supply, need to be used in connection with the system; a simple, efficient AC to DC rectified circuitry is sufficient. This allows the light engine to be incorporated into compact assemblies—for example, bulb assemblies that fit into standard light bulb sockets.

LED Devices

Any suitable class of LED device 104 may be used in connection with the present invention, including individual die, chip-scale packages, conventional packages, surface mounted devices (SMD), or any other LED device now known or developed in the future. In the embodiment described in conjunction with FIG. 3, for example, LED devices 104 comprise surface mount devices having electrical contacts that mount directly onto the surface of trace pattern 106, e.g., "flip-chip" or solder-bumped die.

Figure 4:
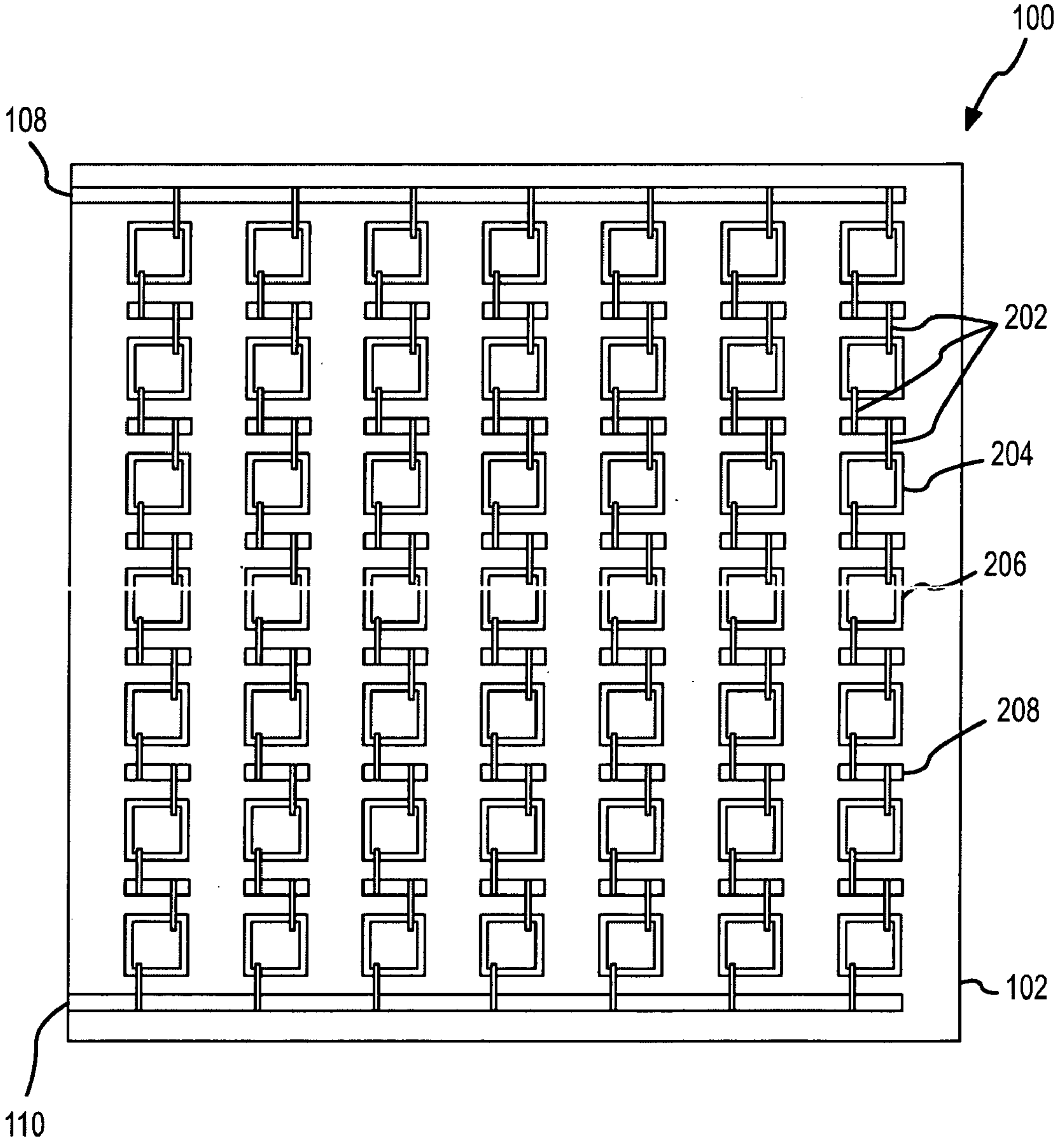
FIG. 4 is a top view of a light engine in accordance with an alternate embodiment of the present invention having a plurality of wire-bonded LED chips configured in parallel and series, wherein the LED chips each include two bond pads.
Figure 5:
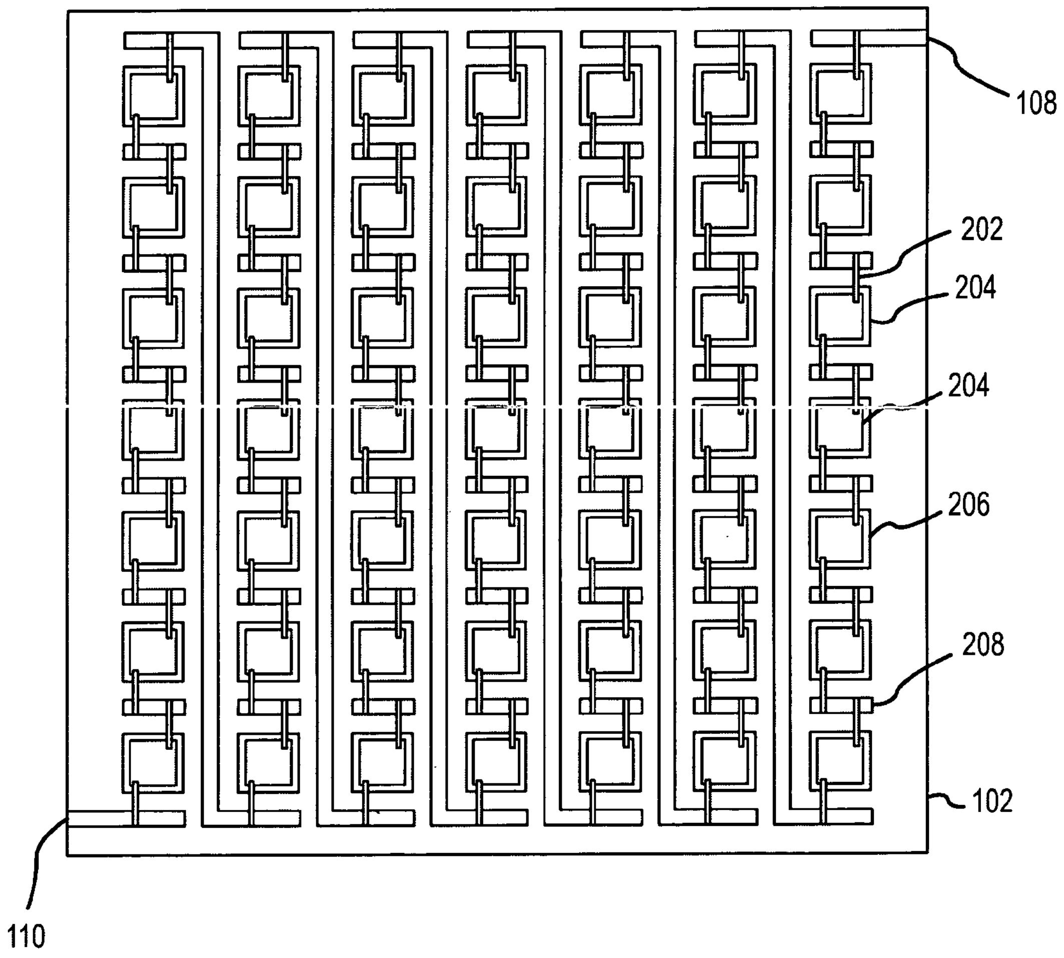
FIG. 5 is a top view of a light engine in accordance with an alternate embodiment of the present invention having a plurality of wire-bonded LED chips configured in series.

Alternatively, referring now to FIGS. 4 and 5, the LED devices may comprise LED chips 204 bonded (via thermally conductive epoxy bonds or the like) to respective PCB pads 206 wherein each die 204 has at least two bond-pads for providing electrical connectivity via wire bond interconnects 202. Optionally, intermediate PCB pads 208 may be used to facilitate wire bonding between individual die. This embodiment shows seven parallel sets of seven die connected in series; however, as described above, the invention is not so limited, and may include any number of die connected in series, parallel, or a combination thereof.

Figure 7:
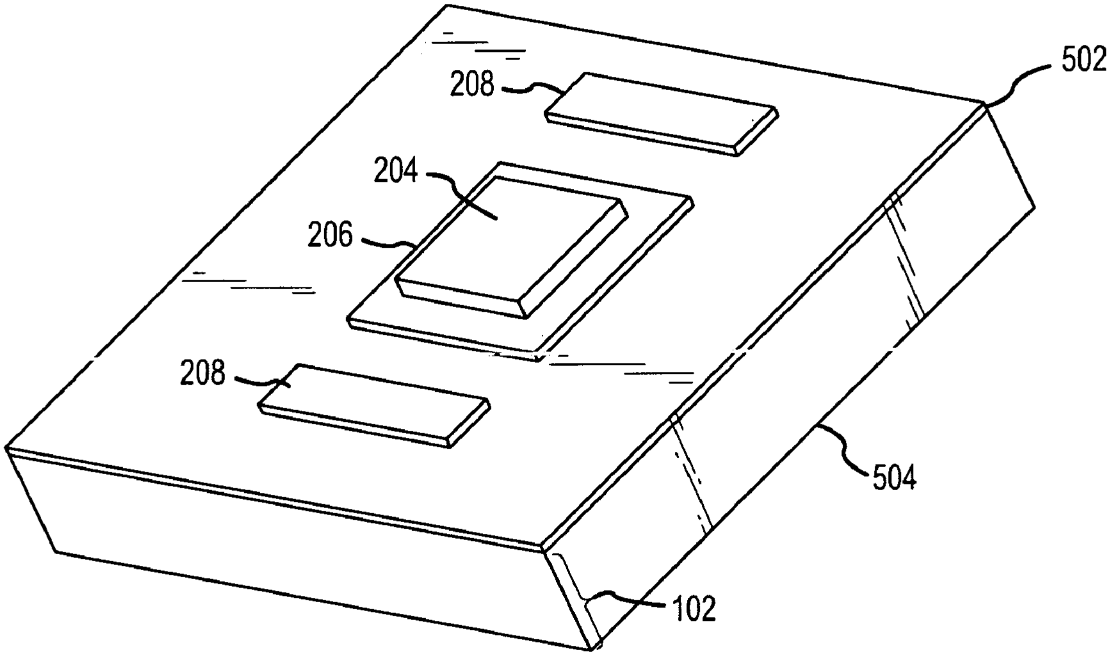
FIG. 7 is an isometric cut-away view of an exemplary light engine comprising an LED die mounted on a metal-clad high-thermal-conductivity PCB substrate.

FIG. 7 depicts an isometric cut-away view of a single LED device as illustrated in FIGS. 4 and 5. As shown, substrate 102 comprises a high thermal-conductivity base 504 with an overlying high thermal-conductivity, electrically-insulating material 502. Individual PCB traces 208 and 206 are disposed on layer 502, and LED die 204 is bonded to PCB trace 206. Wire bonds (not shown) are used to interconnect die 204 with adjacent die (e.g., using intermediate PCB traces 208).

Figure 6:
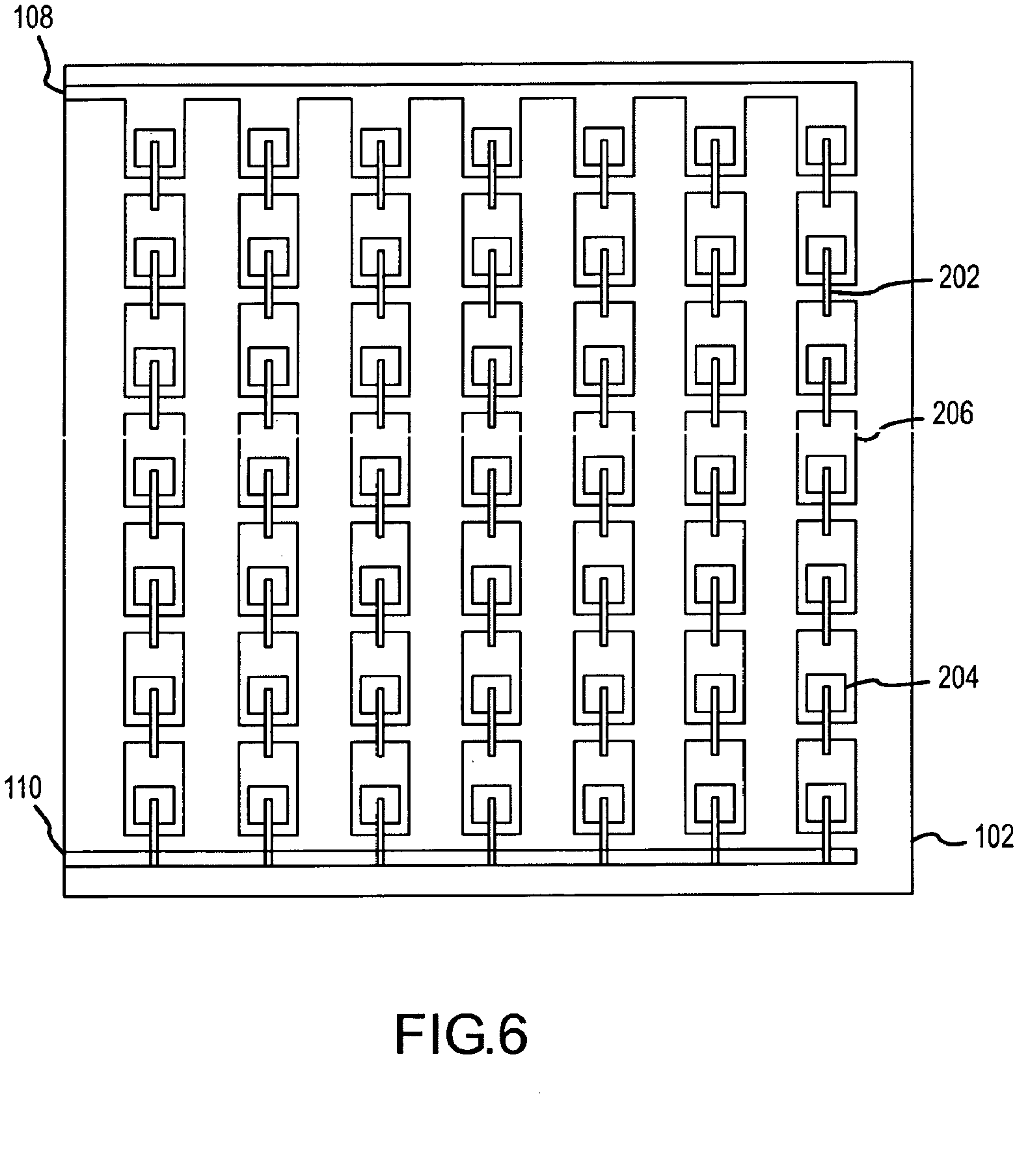
FIG. 6 is a top view of a light engine in accordance with an alternate embodiment of the present invention having a plurality of wire-bonded LED chips configured in parallel and series, wherein the LED chips each include a single bond pad.

FIG. 6 shows yet another embodiment of the present invention. In accordance with this design, the individual LED die 204 are bonded (via solder bond or other electrically conductive bond) to a PCB pad 206. Individual wire bonds 202 are then used to connect the PCB pads 206 to a bond region on an adjacent die. That is, each LED die 204 includes a single bond pad, and the backside of the die acts as the second electrical contact.

LED devices 104 are manufactured using one or more suitable semiconductor materials, including, for example, GaAsP, GaP, AlGaAs AlGaInP, GaInN, or the like. The size of selected LED devices 104 may be determined using various design parameters. In one embodiment, LED devices 104 are 750×750 micron square die with a thickness of about 100 microns. Those skilled in the art will appreciate that the invention is not so limited.

Individual LED devices have particular colors corresponding to particular wavelengths (or frequencies). Various aspects of the present invention relates to various light selection, enhancing and smoothing mechanisms and/or techniques, discussed now and hereinbelow. For example, multiple LEDs of various colors to produce the desired color of emitted light. In general, the set of LED devices mounted on the substrate includes x red LEDs, y green LEDs, and z blue LEDs, wherein the ratio x:y:z is selected to achieve a white light particular correlated color temperature (CCT).

In general, any number of LED colors may be used in any desirable ratio. A typical incandescent light bulb produces light with a CCT of 2700 K (warm white light), and a fluorescent bulb produces light with a CCT of about 5000 K. Thus, more red and yellow LEDs will typically be necessary to achieve 2700 K light, while more blue LEDs will be necessary for 5000 K light. To achieve a high Color Rendering Index (CRI), a light source must emit white light with a spectrum covering nearly the entire range of visible light (380 nm to 770 nm wavelengths), such that dark red, light red, amber, light green, dark green, light blue and deep blue should be placed in the mix.

Figure 13:
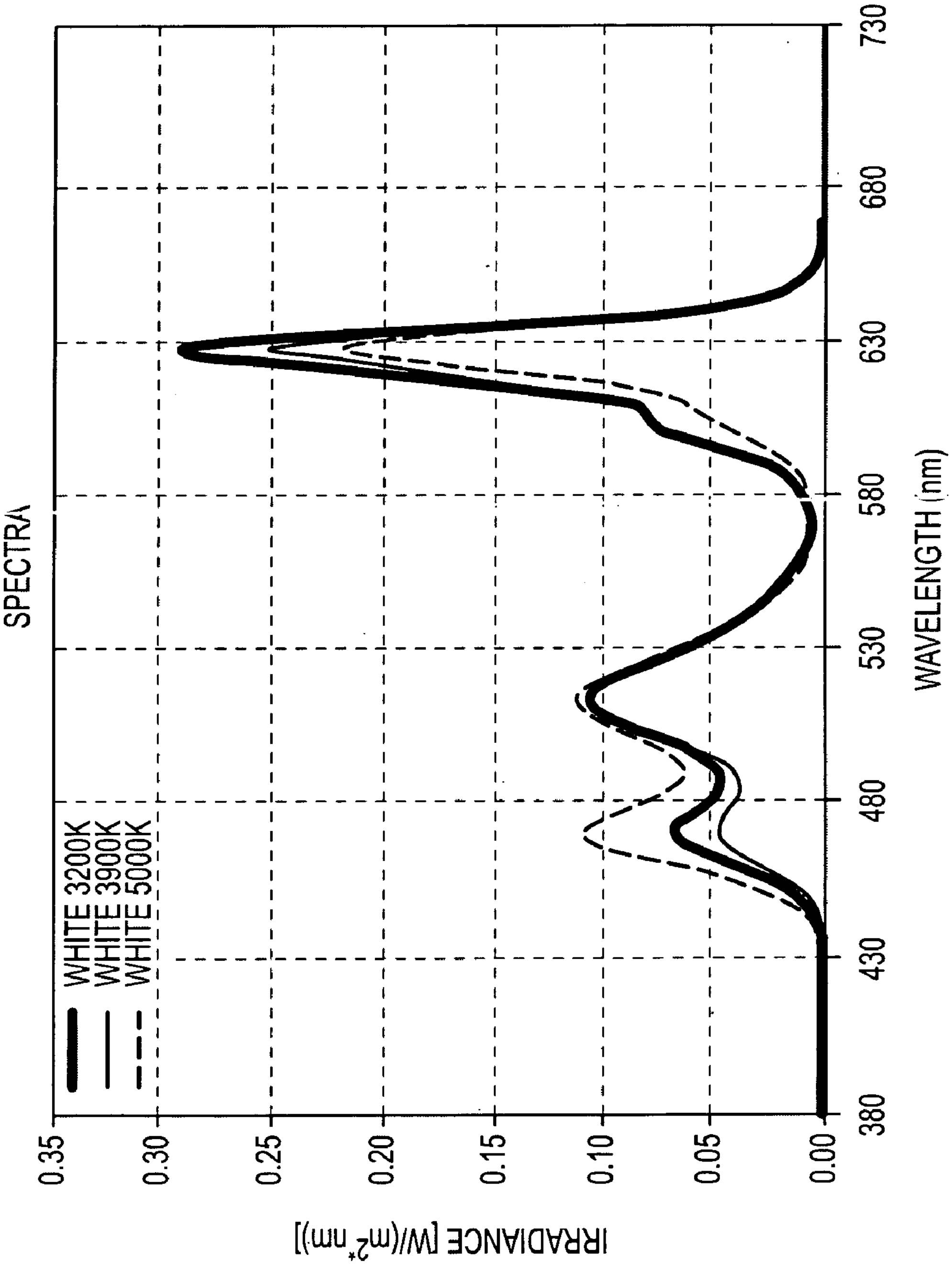
FIG. 13 is a graph showing the spectra of various temperatures of white light.

The present invention allows LED devices with different wavelengths to be incorporated into the light engine in order to achieve these goals. In one embodiment, for example, the mixing ratio (with respect to number of LEDs) of R (620 nm):Y (590 nm):G (525 nm):B (465 nm) is 6:2:5:1 to achieve 3200K light. In accordance with another embodiment, a R:Y:G:B mixing ratio of 7:3:7:2 is used to achieve 3900K light. In yet another embodiment, a ratio of 10:3:10:4 is used to achieve 5000K light. The spectra for each of these three embodiments is shown in FIG. 13.

It will be appreciated that the cited mix ratios are dependant on the intensity of the chips as well as their wavelengths. Accordingly, the present invention is not limited in the number of types of LEDs that could be used to build a desired light output.

In addition to white light, the present invention may be used to produce particular colors of light using similar color blending techniques. That is, while it is often possible to use a number of single-color LEDs to produce the desired color, it is also desirable in some instances to use two or more colors of LEDs combined to form a composite color.

More specifically, due to the material properties of LED compound semiconductors, the efficacy of certain wavelengths is undesirable. For example, no traditional compound semiconductor materials can emit yellow light at 575 nm efficiently. This wavelength, 575 nm, is located at the performance valley between AlGaInP and GaInN semiconductors. By mixing LED devices fabricated from both of these materials, however, yellow light with the desirable efficacy can be produced.

Substrate

Substrate 102 comprises any structure capable of providing mechanical support for the LED devices 104 or LED dies 204 while providing desirable thermal characteristics—i.e., by assisting in dissipating all or a portion of the heat generated by LED devices 104 or LED dies 204. In this regard, substrate 102 preferably comprises a high-thermal-conductivity substrate.

As used herein, the term "high-thermal-conductivity substrate" means a substrate whose effective thermal conductivity greater than 1 W/° K-m, preferably greater than about 3 W/° K-m The geometry and material(s) of substrate 102 may therefore vary depending upon the application. In one embodiment, substrate 102 comprises a metal-clad PCB, for example, the Thermagon T-Lam or Bergquist Thermal Clad substrates. These metal clad PCBs may be fabricated using conventional FR-4 PCB processes, and are therefore relatively cost-effective. Other suitable substrates include various hybrid ceramics substrates and porcelain enamel metal substrates. Furthermore, by applying white masking on the substrate and silver-plating the trace circuitry, the light reflection from the substrate can be enhanced.

Encapsulant Layer

A substantially transparent polymeric encapsulant is preferably disposed on the LED devices then suitably cured to provide a protective layer. In a preferred embodiment, this encapsulant comprises an optical-grade silicone. The properties of the encapsulant may be selected to achieve other optical properties, e.g., by filtering the light produced by the LED devices. At the same time, this protective encapsulant layer is soft enough to withstand the thermal excursions to which the assembly is subjected without fatiguing the die, wire bonds, and other components.

Figure 8:
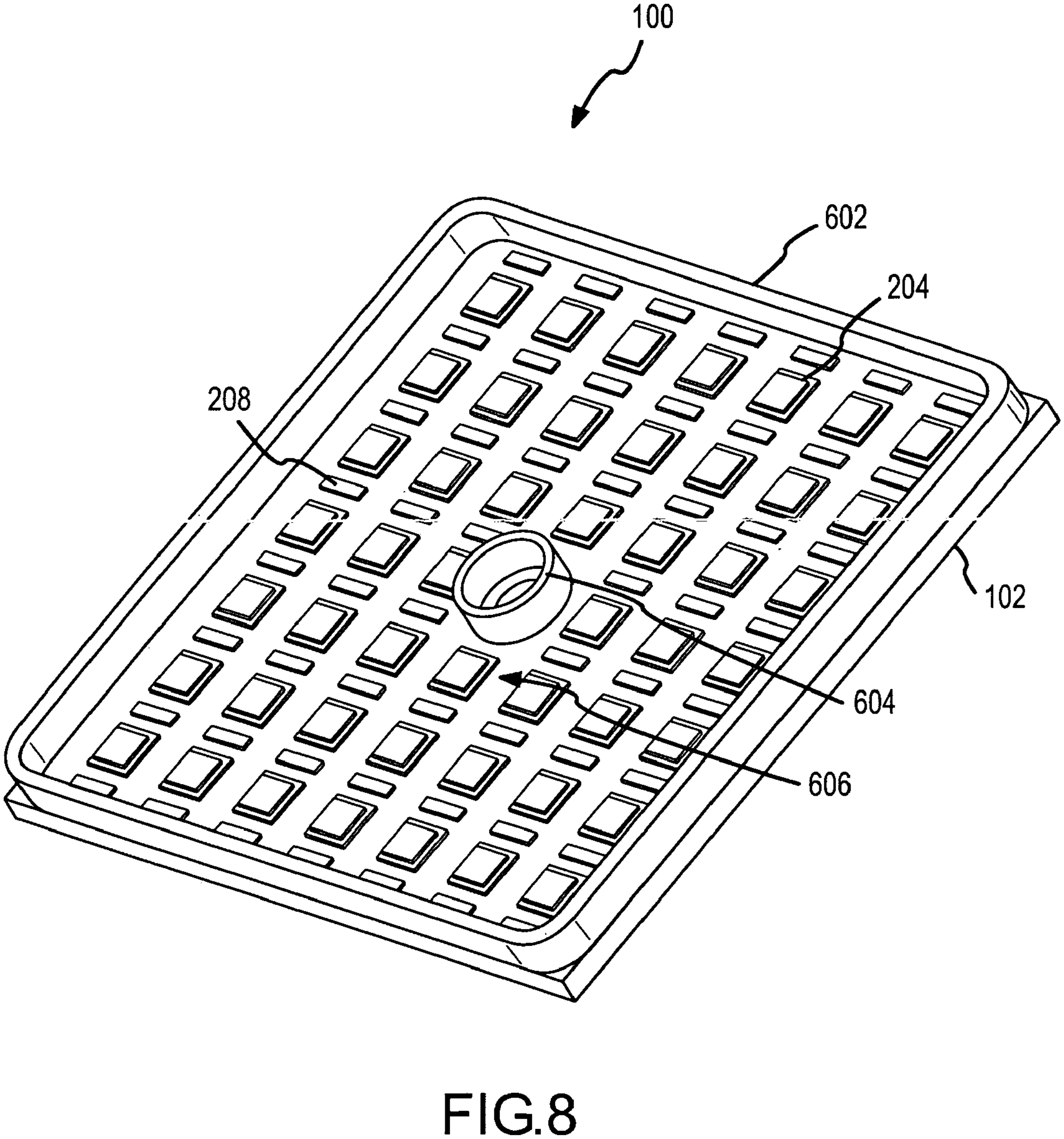
FIG. 8 is an isometric overview of a light engine including an inner dike and an outer dike.
Figure 9A:
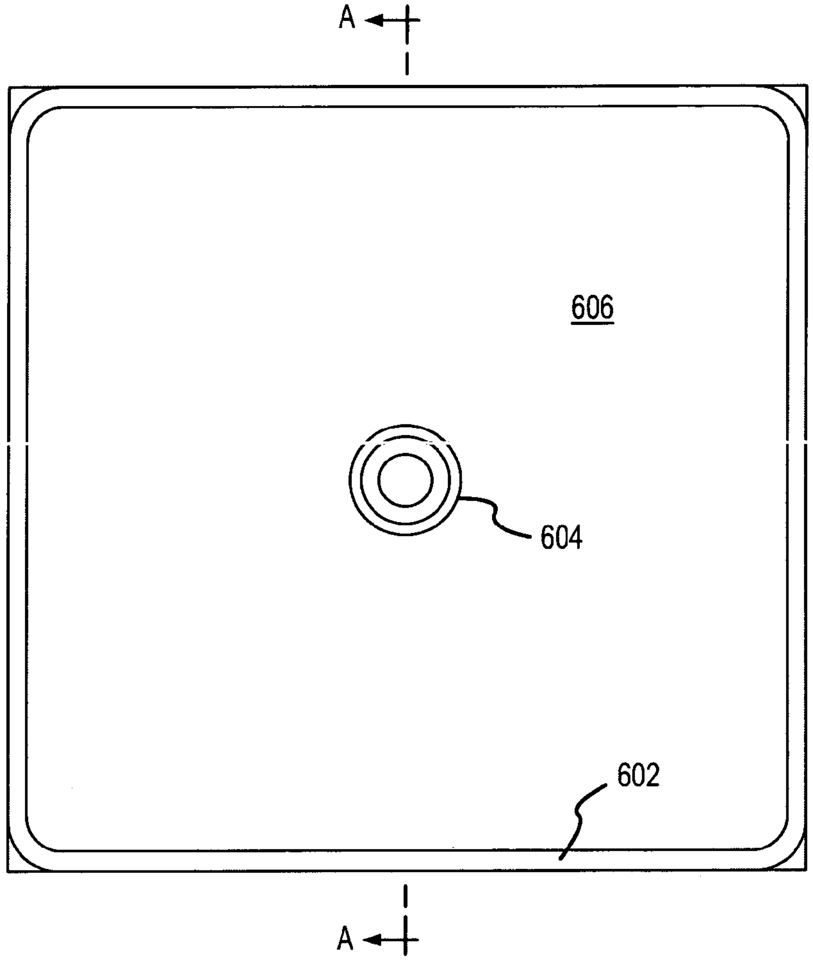
FIGS. 9A and 9B show top and side views, respectively, of a light engine including an outer and inner dike filled with an encapsulant material.
Figure 9B:
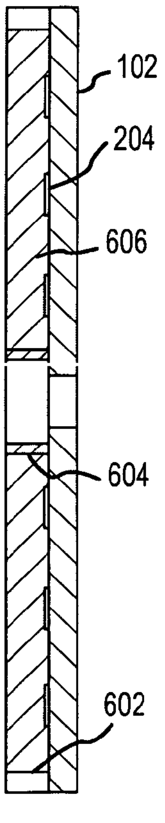

FIGS. 8, 9A, and 9B show various views of one embodiment of the present invention wherein the encapsulant covering the LED devices is suitably restrained by a dike structure. More particularly, the light engine 100 of FIG. 8 comprises an outer dike 602 which surrounds at least a portion of LED die 204. In the preferred embodiment, dike 602 is a generally rectangular, square, hexagon, round, octagon, or oval structure surrounding the entire array of LED die 204. Outer dike 602 is suitably bonded to substrate 102 using an adhesive or other desirable bonding method. A circular dike is preferred for optical reasons.

As shown, the encapsulant material is preferably deposited over LED die 204 such that it fills the volume defined by outer dike 602. That is, referring to the cross-section shown in FIG. 9B (section A—A), encapsulant material 606 is filled to the top surface of outer dike 602. Furthermore, outer dike 602 is preferably fabricated from a substantially transparent material, e.g., a transparent plastic (e.g., polycarbonate) material. This transparency will allow emission of light around the edges of the light engine.

In an alternate embodiment, a second, inner dike 604 is positioned near the center of the LED die 204. Inner dike 604 functions to restrain the encapsulant, and is preferably a transparent material. The presence of inner dike 604 allows connections to be made through the center of the board.

Reflector

In accordance with still another embodiment of the present invention, LED device further comprises a reflector 802 configured to assist in focusing and/or direct the light produced by the light engine 100. For example, in accordance with one exemplary embodiment, reflector 802 is generally conical-shaped. Of course it should be appreciated by one skilled in the art that numerous shapes of reflector 802 may be used in the context of the present invention, depending on desired results and effects. For example, reflector 802 may be parabolic, angular, or some other desirable shape and size. Additionally, it is generally desirable tat the texture and material of reflector 802 be highly-reflective. Thus, in such embodiments, reflector 802 preferably has a generally smooth, polished, mirror-like inner surface.

However, in applications of LED device where a substantially white light (or other particular color) is targeted, and where two or more colors of LEDs are used in combination to produce that color, preferably the inner surface of reflector 802 acts to diffuse the light produced by the LED devices so as to provide optimal color blending, even if the efficiency or focus of the light engine might thereby be slightly reduced (due to light scattering). For example, in some embodiments of the present invention, where two or more LED colors are usdd, the inner surface of reflector 802 is textured by now known or as yet unknown process for "texturing" a surface. In this regard, reflector 802 may be faceted, sand-blasted, chemically roughened, or otherwise textured to provide the desired diffusivity. Furthermore, the texture or facets may be random, regular, stochastic, or a combination thereof.

In an alternate embodiment, the light engine includes a reflector ring which substantially surrounds the LED devices and helps to focus and/or direct the light produced by the system.

Figure 10:
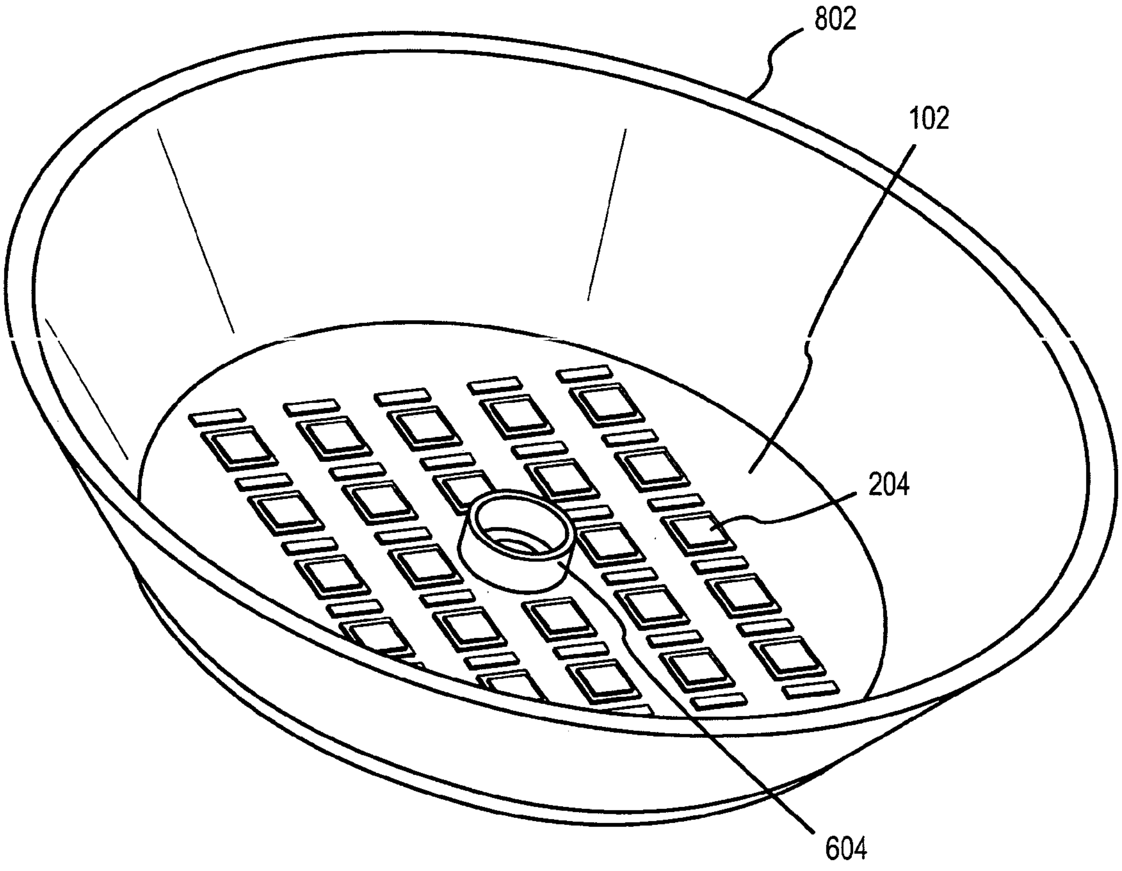
FIG. 10 is an isometric overview of a light engine including a reflector and an inner dike.
Figure 11A:
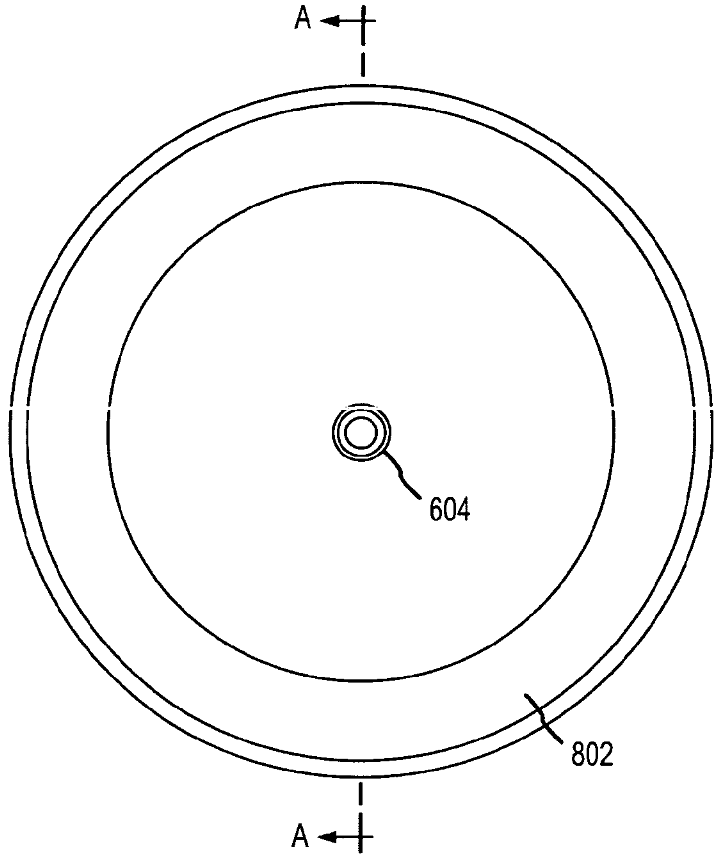
FIGS. 11A and 11B are top and side views, respectively, of the light engine illustrated in FIG. 10.
Figure 11B:
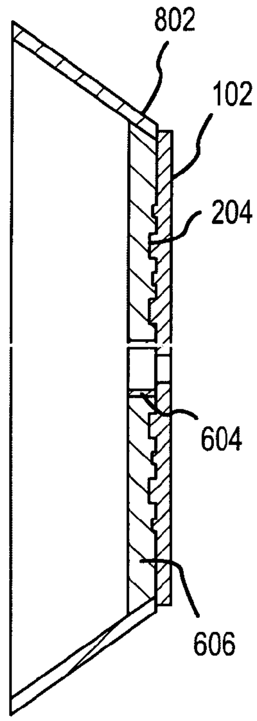

Referring to FIG. 10, an exemplary reflector 802 is suitably bonded to substrate 102 of the light engine in such a way that the all of the LED die 204 are located at the base of the reflector. In the illustrated embodiment, reflector 802 is generally conical-shaped. It will be appreciated, however, that reflector 802 may be parabolic, angular, or have any other desirable shape and size. As shown, reflector 802 acts as the outer dyke by restraining encapsulant.

To the extent that reflector 802 is designed to direct and focus light produced by the LED die 204, it is desirable that the texture and material of reflector 802 be highly-reflective. In this regard, reflector 802 preferably has a generally smooth, polished, mirror-like inner surface.

In applications where a substantially white light (or other particular color) is targeted, and where two or more colors of LEDs are used in combination to produce that color, it is preferred that the inner surface of reflector 802 act to diffuse the light produced by the LED devices so as to provide optimal color blending, even though the efficiency or focus of the light engine might thereby be slightly reduced (due to light scattering). Accordingly, in applications where two or more LED colors are used, the inner surface of reflector 802 is preferably textured through a suitable process and at a suitable scale. For example, reflector 802 may be faceted, sand-blasted, chemically roughened, or otherwise textured to provide the desired diffusivity. Furthermore, the texture or facets may be random, regular, stochastic, or a combination thereof.

Additional Optical Components

In accordance with still another embodiment of the present invention, the LED device comprises a lens 30 for protecting light engine 100. For example, as shown in FIG. 2, lens 30 is proximate to a center cavity surrounding light engine 100. In accordance with carious embodiments, lens 30 is configured from hard glass, plastic (e.g., polycarbonate) or similar materials which aid in preventing damage to light engine 100, but still allow the passage of light. Most preferably, lens 30 is configured from optical quality materials.

In accordance with a further embodiment of the present invention, an integrated light engine with one or more optical components are provided on the surface of the encapsulant to provide a desired optical effect with respect to the light being emitted by the LED devices. These optical components, which may themselves be a hard glass or plastic, do not pose a danger to the LED devices as the encapsulant layer acts as a protective surface. Suitable optical components include, for example, various lenses (concave, convex, planar, "bubble", fresnel, etc.) and various filters (polarizers, color filters, etc.).

In accordance with a further embodiment of the present invention, one or more optical components are provided on the surface of the encapsulant to provide a desired optical effect with respect to the light being emitted by the LED devices. These optical components, which may themselves be a hard glass or plastic, do not pose a danger to the LED devices as the encapsulant layer acts as a protective surface. Suitable optical components include, for example, various lenses (concave, convex, planar, "bubble", fresnel, etc.) and various filters (polarizers, color filters, etc.).

Figure 12A:
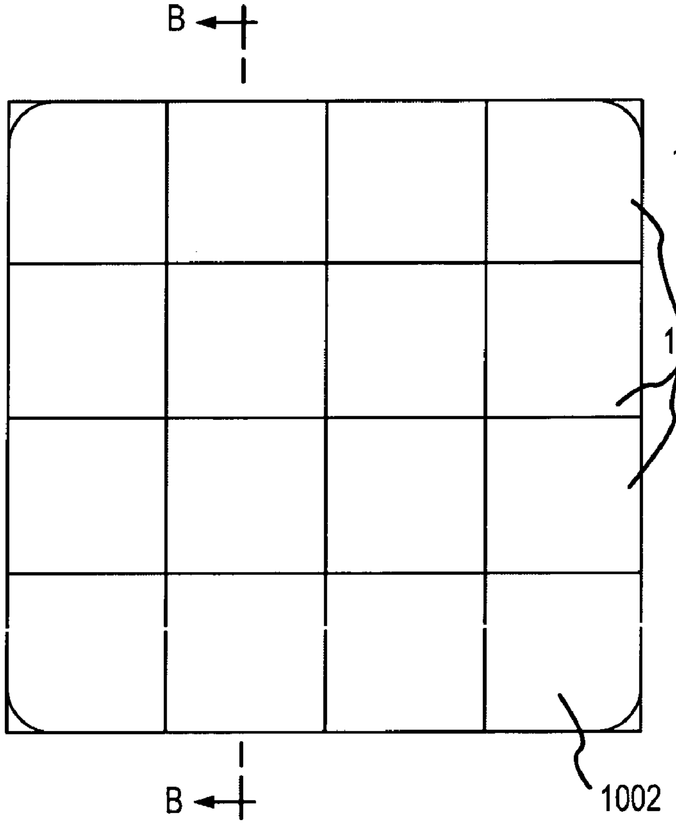
FIGS. 12A and 12B are top and side views, respectively, of a light engine incorporating an exemplary lens.
Figure 12B:
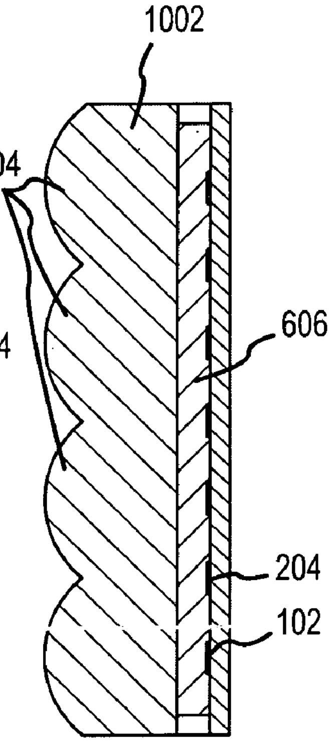
Figure 12C:
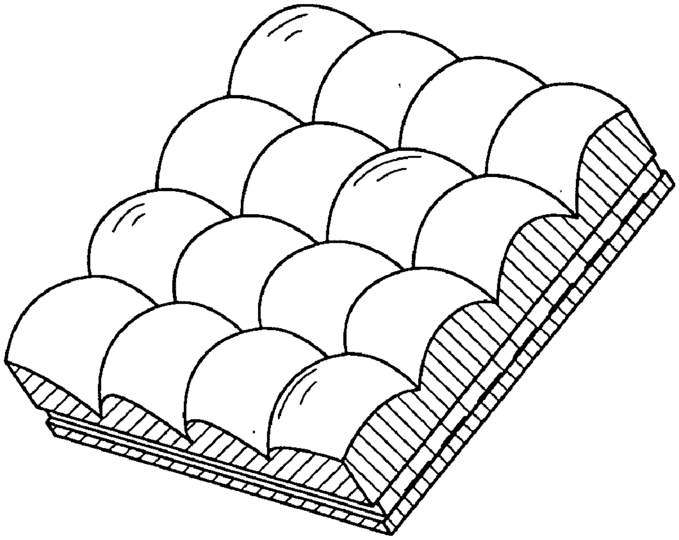

FIGS. 12A, 12B, and 12C show top, cross-sectional, and isometric views of a light engine in accordance with one embodiment of the present invention wherein the light engine incorporates a "bubble" lens. More a bubble lens 102 includes a flat side interfacing with encapsulant 606, and a bubble side comprising multiple convex regions 1004. In the illustrated embodiment, bubble lens 102 includes a 4×4 grid of such bubbles. The present invention contemplates any number and size of such lens features.

CONCLUSION

In brief, the present invention provides a novel, high-efficiency multi-chip-on-board LED light engine capable of which may be used in any conceivable lighting application now known or developed in the future. For example, such light engines may be used in applications calling for light bulbs fitting into standard household fixtures (standard screw-in bulbs, fluorescent bulbs, halogen bulbs, etc.), automotive applications (tail lights, head lights, blinkers, etc.), portable lighting applications, and traffic control applications (traffic signals, etc.). Furthermore, the claimed light engines may be used in applications calling for a particular color or range of colors, including white light of any desirable color temperature. Nothing in this application is intended to limit the range of application in which the invention may be used.

Other advantages and structural details of the invention will be apparent from the attached figures, which will be well understood by those skilled in the art. The present invention has been described above with to a particular exemplary embodiment. However, many changes, combinations and modifications may be made to the exemplary embodiments without departing from the scope of the present invention.

What is claimed is:

1. An LED lighting device for use in place of a commercial-standard light bulb, the commercial-standard light bulb having a first outer surface profile, the LED lighting device comprising:

an LED light engine and a self-contained power converter; and a heat sink in communication with said LED light engine and a socket connector for dissipating energy generated by the LED light engine, said heat sink including a plurality of fins situated radially with respect to the major axis of said heat sink and having a second outer surface profile configured to substantially mimic said first outer surface profile, wherein said self-contained power converter is contained within said socket connector and said light engine is embedded in a recessed cavity formed in a first end of said heat sink, wherein said recessed cavity includes a surface comprising a reflecting surface, and said socket connector is configured to electrically and mechanically connect to a commercial lamp fixture.

2. An LED lighting device according to claim 1, wherein said reflecting surface is substantially smooth.

3. An LED lighting device according to claim 1, wherein said reflecting surface further comprises facets.

4. An LED lighting device according to claim 3, wherein said facets are configured randomly on said reflecting surface.

5. An LED lighting device according to claim 3, wherein said facets are configured uniformly on said reflecting surface.

6. An LED lighting device according to claim 3, wherein the LED light engine comprises more than one LED chip and wherein said faceted reflector improves mixing of light generated by each of said LED chips.

7. An LED lighting device according to claim 1, further comprising a lens.

* * * * *